United States Patent [19]
Sauvanet

[11] 3,992,638
[45] Nov. 16, 1976

[54] SYNCHRONOUS SWITCH

[75] Inventor: Maurice Sauvanet, Fontenay-Le-Fleury, France

[73] Assignee: Silec-Semi-Conducteurs, Paris, France

[22] Filed: Feb. 22, 1974

[21] Appl. No.: 445,033

[30] Foreign Application Priority Data
Mar. 1, 1973 France .............................. 73.07376

[52] U.S. Cl. ...................... 307/252 B; 307/252 VA
[51] Int. Cl.[2] ........................................ H03K 17/72
[58] Field of Search ......... 307/252 B, 252 D, 252 F, 307/252 N, 252 VA, 252 W

[56] References Cited
UNITED STATES PATENTS

| | | | |
|---|---|---|---|
| 3,196,330 | 7/1965 | Moyson | 317/235 |
| 3,257,566 | 6/1966 | White | 307/252 D |
| 3,328,606 | 6/1967 | Pinckaers | 307/252 B |
| 3,335,291 | 8/1967 | Gutzwiller | 307/252 B |
| 3,392,284 | 7/1968 | Cain | 307/252 B |
| 3,450,891 | 6/1969 | Riley | 307/252 B |
| 3,577,010 | 5/1971 | Freyling, Jr. et al. | 307/252 VA |
| 3,636,379 | 1/1972 | Moe et al. | 307/252 F |
| 3,648,074 | 3/1972 | Nurnberg | 307/252 F |
| 3,668,422 | 6/1972 | Pascente | 307/252 B |
| 3,723,769 | 3/1973 | Collins | 307/252 B |
| 3,764,832 | 10/1973 | Stettner | 307/252 B |

*Primary Examiner*—John Zazworsky
*Attorney, Agent, or Firm*—Sughrue, Rothwell, Mion, Zinn & Macpeak

[57] ABSTRACT

A synchronous switch for alternating circuits or rectified alternating circuits, the operation of which is automatically synchronized on the passage to zero of the load voltage at its terminals. This synchronous switch contains essentially a semi-conductor element selected from thyristors of a particular type and possibly a diode. The semiconductor element comprises two main electrodes and a control electrode. This element can only be triggered at times when the polarity of the control voltage at the gate is the reverse of that of the first main electrode, and once triggered it then remains closed until the load current crossing it is reduced to zero. The main electrodes may be connected to a rectifier bridge to provide an alternating current switch. The main electrodes may also be connected across a diode, and the devices thus formed can be used to interrupt each phase of a polyphase load current.

These synchronous switches are used for the synchonized interruption of load circuits irrespective of the nature of the load (resistive or reactive) or for the control of main switches.

8 Claims, 17 Drawing Figures

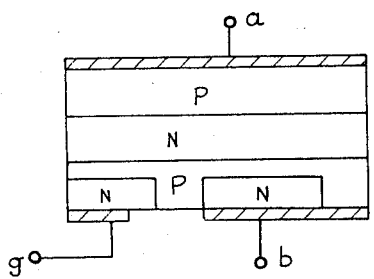
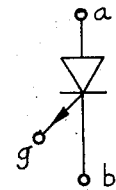
Fig. 1A  Fig. 1B
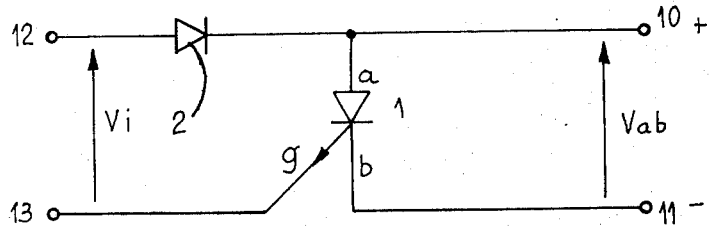
Fig. 1C
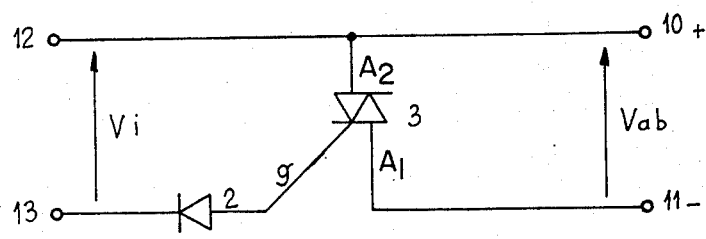
Fig. 1D
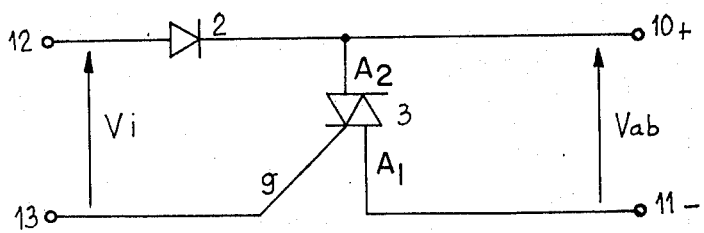
Fig. 1E

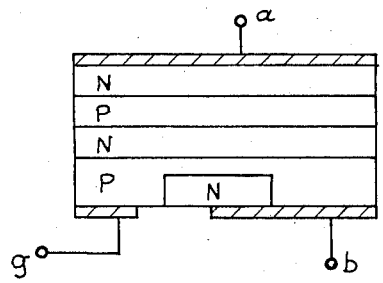
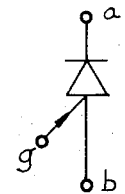
Fig_2A  Fig_2B
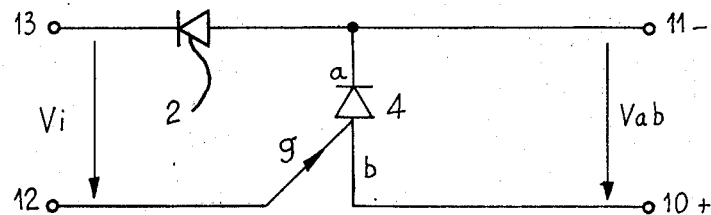
Fig_2C
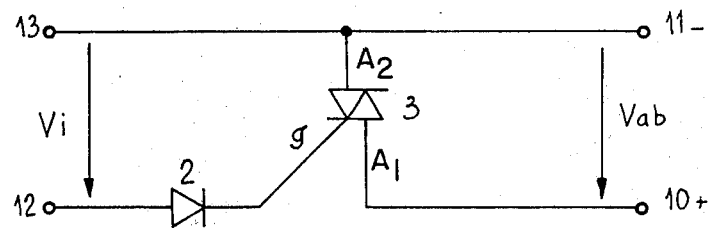
Fig_2D
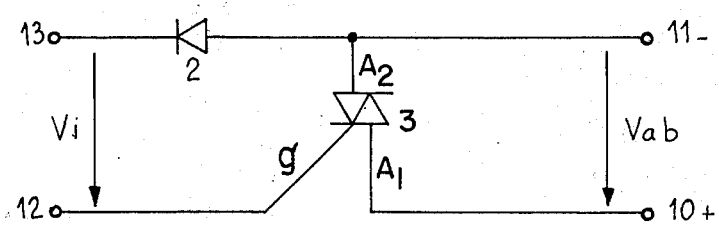
Fig_2E

SYNCHRONOUS SWITCH

BACKGROUND OF THE INVENTION

1. Field of the Invention

The present invention relates to a new synchronous switch. A switch of this type is a static device designed to open or close a load circuit supplied with a rectified alternating or alternating load current in synchronism with a passage of the voltage to a predetermined value close to zero and in response to a control voltage. The intention is thus to synchronize the closing of the switch is such a way that its operation (closing, opening of the circuit) takes place at times when the instantaneous power is relatively low. To this end, the switch is designed to operate in the following manner irrespective of the nature of the load (resistive or reactive):

to close approximately at the time of the first passage to zero of the load voltage following the application of a control voltage, to remain in the closed state until the load current drops down even if the control voltage has been removed of if the voltages at the terminals of the switch rise above the threshold value and, to open the circuit appoximately at the time of the passage to zero of the load current and to reclose automatically immediately after this instant as long as the control voltage is maintained; or alternatively, to keep the circuit in the open state if the control voltage has been removed until the time of the first passage to zero of the load voltage following the possible reapplication of the control voltage.

2. Description of the Prior Art

The synchronous switches as described in the prior art are generally formed by superposing two electric circuits, an interrupting circuit as such and a control circuit, each of these circuits consisting of one or more semi-conductor elements. U.S. Pat. No. 3,848,158 describes a circuit of this type. In one known type, the switching element is a thyristor, the gate of which is controlled by a control circuit comprising essentially a second thyristor. In this type of circuit, precautions must be taken to avoid the appearance of leakage current in the gates of the thyristors or other semi-conductor elements forming parts thereof. On the other hand, the control circuit supplies a short impulse to the gate of the thyristor which may be insufficient for it to remain in the conducting state for an entire period, for example, when the load placed in the load circuit is highly inductive, which causes a slow initial variation of the current as a function of time.

SUMMARY OF THE INVENTION

A first object of the present invention is to provide a simple synchronous switch consisting of a single semi-conductor element in addition to possibly one or more diodes.

Another object of the present invention is to provide a switch in which there is no current leakage in the gate apart from at the times when triggering is desired.

Another object of the present invention is to provide a switch which remains closed until the current flowing through it diminishes to a zero value.

Another object of the present invention is to provide a switch in which means are provided for galvanically insulating the switching circuit with respect to the control circuit.

To achieve this aim and others, the synchronous switch according to the present invention may consist essentially of a semi-conductor element comprising at least four layers of alternate doping. This may be a thyristor type derivative comprising a first main electrode, a second main electrode and a control electrode, the control electrode being referenced to the potential of the second main electrode. This device and its mode of control are such that by reason of its construction and without using a phase inverter it can only be triggered when the polarity of the voltage at the control electrode is the reverse of that at the first main electrode with respect to the second main electrode. This being the case, if control voltage is applied between the first main electrode and the control electrode, the device can only be triggered when the control voltage to close is considerably greater than the voltage between the two main terminals of the device. That is, if the voltage between the main terminals of the device is a variable voltage which is capable of decreasing at certain instants, the device is only triggered if this voltage decreases below a threshold value depending on the amplitude of the control voltage. Once the device has been triggered, it remains in the conducting state as long as the current crossing it remains greater than its holding current even if the voltage between the main terminals becomes greater than the voltage between the first main terminal and the control terminal or if the control voltage is removed.

BRIEF DESCRIPTION OF THE DRAWINGS

Other objects, features and advantages of the present invention will be made apparent from the following detailed description thereof provided with reference to the accompanying drawings, in which FIG. 1A is a diagrammatic view of a gate junction thyristor;

FIG. 1B represents the normal symbol for a gate junction thyristor;

FIG. 1C represents an embodiment according to the present invention utilizing a gate junction thyristor;

FIGS. 1D and 1E represent equivalent embodiments to the one shown in FIG. 1C employing a triac respectively;

FIG. 2A is a diagrammatic view of a p-type anode-gate thyristor;

FIG. 2B represents the normal symbol for a p-type anode-gate thyristor;

FIG. 2C represents an embodiment according to the present invention employing a p-type anode-gate thyristor;

FIGS. 2D and 2E represent equivalent embodiments to the one shown in FIG. 2C each employing a traic respectively;

DESCRIPTION OF THE PREFERRED EMBODIMENT

Figure 3:
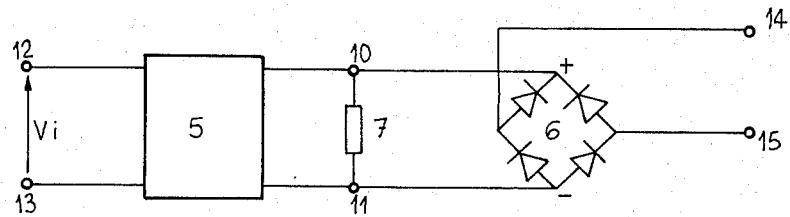
FIG. 3 represents an embodiment in which a synchronous switch according to the present invention is used as a bidirectional switch.

According to a first embodiment, the semi-conductor element comprising at least four layers of alternate doping is a junction gate thyristor, an example of the configuration of which is shown in FIG. 1A. The first main electrode a is generally termed the anode, the second main electrode b, the cathode, and the control electrode g, the gate. This particular type of thyristor is characterized by the property of only allowing the passage of current in the direction from the anode a towards the cathode b and of only being placed in the conducting state by the application at the gate g of a control voltage having a negative polarity with respect to the cathode b. This junction gate thyristor will be represented by the symbol shown in FIG. 1B.

FIG. 1C represents the arrangement of the junction gate thyristor 1 in a first embodiment. This circuit comprises four terminals 10, 11, 12 and 13. The anode a is connected to the terminals 10 and 12, the cathode b, to the terminal 11, and the gate g, to the terminal 13. A rectified voltage, the interruption of which it is wished to control, is applied between the terminals 10 and 11 in such a way that the electrode a is generally positive with respect to the electrode b, and the control voltage $V_i$ is applied between the terminals 12 and 13. If the control voltage $V_i$ has at certain instants a polarity such that the point 12 is positivve with respect to the point 13, the device 1 thus connected will be triggered each time the polarity of the control voltage at its control electrode g is negative with respect to its cathode b, that is, precisely as stipulated above.

A diode 2 may be connected in series either between the terminal 12 and the anode a or, alternatively between the gap and the terminal 13 with a polarity such that it allows the passage of the current from the cathode b towards the terminal 13 across the junction gate thereby blocking leakage currents from circulating from the anode towards the cathode across the gate caused, for example, by burning out the junction gate.

As shown in FIGS. 1D and 1E, a derivative of the thyristor known by the name of a triac 3 may be used in place of the junction gate thyristor to fulfil the same function. The electrodes a and b then correspond to the electrodes of the triac which are generally designated by $A_2$ and $A_1$, respectively, $A_1$ being taken as a reference potential. The control electrode is the gate g, and triggering may be produced by applying to g positive or negative signals with respect to $A_1$ (or b).

According to the present invention, the triac may be inserted in the circuit in such a way that the electrode a is positive with respect to the electrode b. The control voltage then has to be applied between 12 and 13 by inserting a diode 2 which only allows the current to flow in the direction from g towards a across the terminals 13 and 12. When a triac is used, the diode 2 is required to prevent triggering by positive signals even when the junction gate is able to withstand a load voltage of the reverse polarization. The triac also allows current to be conducted from electrode b towards electrode a when a signal is applied between the terminals 12 and 13 and the polarity of the feed voltage is reversed.

According to a second embodiment, the semi-conductor element comprising at least four layers of alternate doping is a p-type anode-gate thyristor, an example of the configuration of which is shown in FIG. 2A. The first main electrode a is a cathode, the second main electrode b, and anode, and the control electrode g, the gate. This particular type of thyristor is characterized by the property of only allowing the passage of current in the direction from the anode b towards the cathode a and of being placed in the conducting state by the application on the gate g of a control voltage having a positive polarity with respect to the anode b. This will be represented by the symbol shown in FIG. 2B.

FIG. 2C represents the arrangement of this p-type anode-gate thyristor 4 in the second embodiment. This circuit also comprises four terminals 10, 11, 12 and 13. The anode b is connected to the terminal 10, the cathode a to the terminals 11 and 13 and the gate g to the terminal 12. A rectified voltage, the interruption of which it is wished to control, is applied between the terminals 10 and 11 is such a way that the electrode a is generally negative with respect to the electrode b. The control voltage $V_i$ is applied between the terminals 12 and 13. The operation of this device with regards to the four terminals 10, 11, 12 and 13 will be the same as that in the case of the first embodiment. In the same way, a diode 2 may be connected in series either between the terminal 13 and the cathode a or, alternatively, between the gate and the terminal 12 with a suitable polarity to allow the passage of a current from the gate g to the anode b of the p-type anode-gate thyristor.

As shown in FIGS. 2D and 2E, a triac may also be used in place of a p-type anode-gate thyristor to fulfil the same function. A diode 2 must be inserted between 12 and 13 so as only to allow the passage of current from a to g.

In the following figures, the synchronous switch will be designated by the reference numberal 5 and may take the form of any of the embodiments indicated in figures 1C, 1D, 1E, 2C, 2D or 2E.

FIG. 3 relates to a third embodiment of the present invention which is employed when the synchronous switch 5 is used as a bidirectional switch. According to the embodiment shown in FIG. 3, the terminals 10 and 11 of the synchrounous switch 5 are connected to a diagonal of a rectifier bridge 6 in such a way that the terminal 10 ia at a positive potential with respect to the terminal 11. The alternating voltage, the interruption of which it is wished to control, is applied to the other diagonal of the rectifier bridge by way of the terminals 14 and 15.

A control voltage $V_i$ is applied between 12 and 13. A current will circulate in the control electrode g of the device 5 when and only when the load voltage $V_{ab}$ has dropped below a threshold value depending on the voltage $V_i$. The device 5 thus only becomes conductive when the load voltage becomes close to a zero value and remains in the conducting state until the next passage through zero of the current in the load connected in the load circuit even if the control voltage $V_i$ is removed before this passage through zero. An impedance 7 may be connected in between the terminals 10 and 11 to allow the circulation of the current which starts the triggering action. If the control voltage $V_i$ is an alternating signal having a high frequency with respect to the frequency of the load voltage, the impedance 7 will advantageously consist of a small capacitance in parallel on a resistance having a high value.

Figure 4:
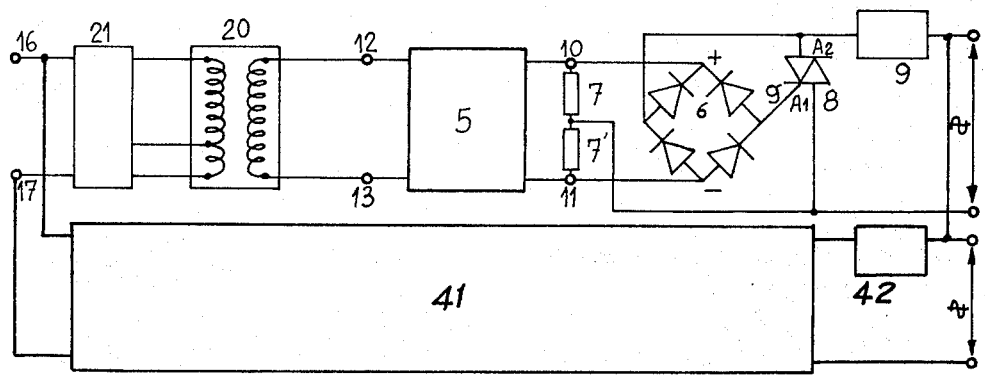
FIG. 4 represents another circuit in which a synchronous switch according to the present invention is used.

FIG. 4 shows an embodiment of the present invention in which the synchronous switch 5 is used as a control device of a main alternating current switch consisting of a triac 8. A diagonal of the rectifier bridge 6 is placed between the electrode $A_2$ of this triac and its gate and the other diagonal is connected to the main terminals 10 and 11 of the synchronous switch 5. This operates as indicated in FIG. 3. In this way, the passage of the load current in the gate of the triac of switch 5 is produced each time a control voltage $V_i$ is present between the terminals 12 and 13 and the instantaneous load voltage decreases considerably below the amplitude of $V_i$. The passage of current in the control electrode $g$ of the device 5 is produced initially across the impedances 7 and 7'.

A tapping point between these impedances may be connected to the electrode $A_1$ of the main triac to prevent any current from reaching its gate at any but the desired times. The load voltage to be interrupted is applied to the main terminals $A_1$ and $A_2$ of the triac 8. A load 9 is also shown connected in series in the load circuit. An interesting feature of this type of control according to the present invention is that the device 5 remains in the conducting state even after the voltage $V_{ab}$ has increased, as long as the current flowing through it is greater than its holding current.

Figure 5A:
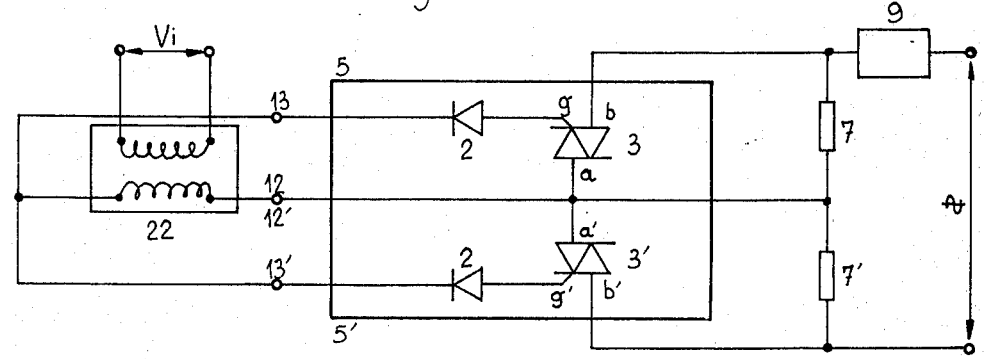
FIGS. 5A and 5B represent two other circuits in which a synchronous switch according to the present invention is used.

FIG. 4 also shows a preferred method of applying the triggering voltage between 12 and 13 according to which this voltage has an alternating frequency far greater than that of the load voltage and is applied through the intermediary of a transformer 20 galvanically insulating the switch of the control circuit. An oscillator 21 is connected to the primary of transfomer 20 and its operation is conditional on a voltage applied between the terminals 16 and 17. The galvanic insulation between 166 and 17 and the triac 8 makes it possible to provide a polyphase synchronous switch by inserting a circuit such as that shown in FIG. 4 in each of the n phases to be interrupted ($n=2$ in the case of a triphase circuit) and by connecting together the terminals 16 and 17 respectively of each of these n-circuits. One of these n-circuits is represented by the block 41 located in the lower part of FIG. 4 and having a load 42 connected in a series in the load circuit FIG. 5a shows another mode of application of the synchronous switching devices according to the present invention to provide an alternating voltage switch. Two of the devices 5 and 5' shown in this figure in one of the embodiments comprising a triac and a diode are connected together by way of their main electrodes $a$ and $a'$ and are inserted in series with the load 9 and the alternating load current by way of the other main electrodes $b$ and $b'$. The signal representing the control voltage $V_i$ is applied in parallel to the two devices between their control terminals 12 and 13 and 12' and 13', preferably through the intermediary of a transformer 22 which provides the galvanic insulation. Impedances 7 and 7', respectively, are connected to the terminals $a$ and $b$ and $a'$ and $b'$ of the triacs 3 and 3'. During positive alternations of the load voltage, the triac 3 is triggered by the current circulating between $b$ and the terminal 13 through the diode 2, but the triac 3' is only conductive if the control voltage $V_i$ was present at the beginning of the positive half cycle when the load voltage had a lower value established by $V_i$ than that of the threshold value. During the negative half cycle it is the triac 3' which is in the conducting state, while the triac 3 blocks the passage of current if it has not been previously triggered approximately at zero voltage.

Figure 5B:
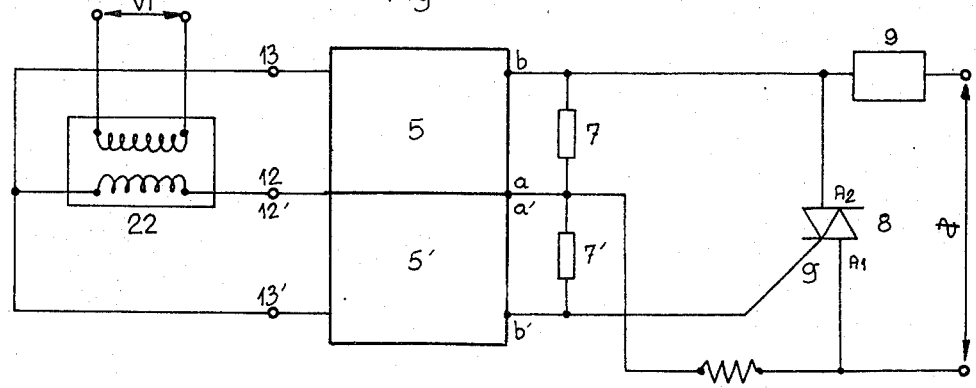

FIG. 5B represents another embodiment in which the embodiment according to FIG. 5A is used as a zero voltage release of a triac 8 which then constitutes the main switch. Apart from the connections shown in FIG. 5A, a triac 8 is connected in such a way that its main electrode $A_2$ is connected to the main terminal $b$ of the device 5 and that its junction between the gate and the main electrode $A_1$ is connected in series between the main electrode $b'$ of circuit 5' and the load voltage. The electrode $A_1$ is also connected to the junction point of the impedances 7 and 7' through a current limiting resistor 23.

Figure 6A:
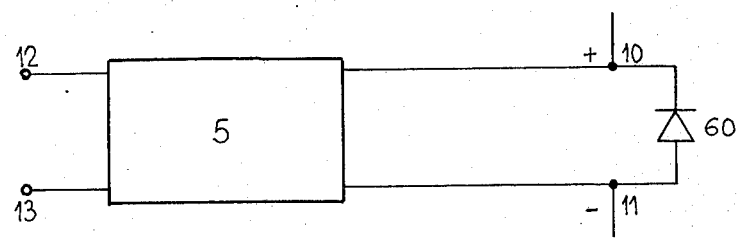
FIG. 6A represents another embodiment of the present invention which is intended for use in polyphase circuits.

FIG. 6A represents another mode of application of the present invention in which a diode 60 is connected to the terminals 10 and 11 of the synchronous switch 5 according to the present invention, these terminals 10 and 11 being permanently connected to the load circuit. When the load circuit is supplied with an alternating current, the diode 60 is polarized in such a way that it allows the passage of half cycles for which the point 10 is negative with respect to the point 11. In the case of half cycles where the point 10 is positive with respect to the point 11, the current only crosses the synchronous switch if a control voltage has been applied to it as described above. The new device according to FIG. 6A from the point of view of the terminals 10 and 11 is thus always in the conducting state for negative half cycles and becomes conductive approximately at zero voltage of positive half cycles if a control signal has been applied between the terminals 12 and 13.

Figure 6B:
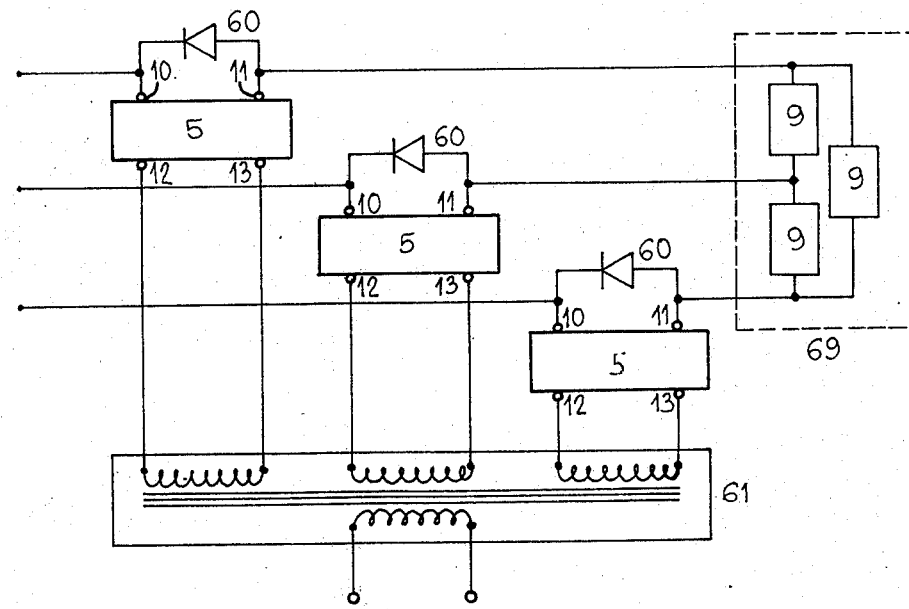
FIG. 6B represents a circuit comprising this other embodiment shown in FIG. 6A arranged in a polyphase circuit.

FIG. 6B shows the use of devices such as the one shown in FIG. 6A for the synchronized interruption of a polyphase current. This figure represents a triphase circuit. Each elementary switch is only triggered when a control voltage has been applied to the transformer 61 and when the voltage at its terminals is close to a zero value. When this elementary switch has been triggered its current is closed by the diode 60 of the elementary switch of another phase. A load 69 is also represented in FIG. 6B.

Different variants of these switches for polyphase circuits may be produced for different applications and are not limited to the embodiments shown in FIGS. 6A and 6B.

Figure 7:
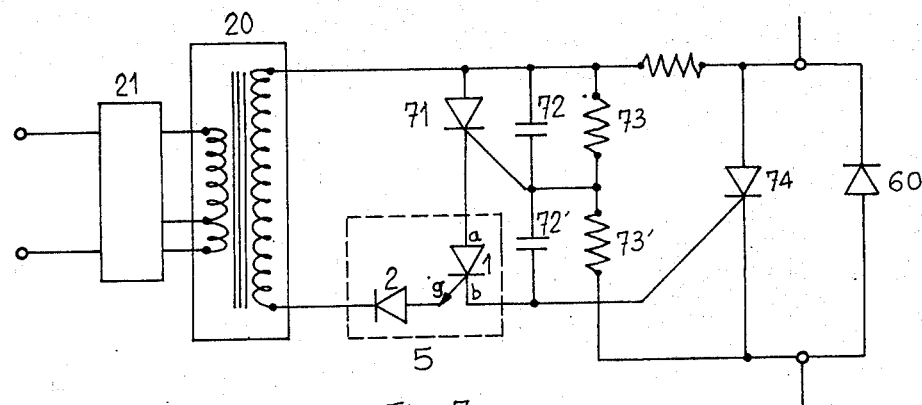
FIG. 7 represents yet another embodiment of the present invention.

FIG. 7 shows an example of one of the possible variants which is particularly useful when the load circuit has a very high power and operating voltage. This circuit is described as employing a synchronous switch 5 according to the embodiment shown in FIG. 1C, but it will be apparent to the person skilled in the art that any of the embodiments of the synchronous switch 5 may be employed. An auxiliary thyristor 71 is connected in series with the triggering thyristor 1. The voltage at the terminals of the unit formed by the two thyristors is shared by the capacitors 72 and 72' and the resistances 73 and 73'. When a high frequency control voltage from oscillator 21 is applied to the terminals of the control circuit by the transformer 20 and the voltage at the terminals of the thyristors 1 and 71 is lower than the amplitude of the control signal, the device 1 is triggered. When it is placed in the conducting state, current is caused to circulate in the junction between the gate and the cathode of the auxiliary thyristor 71 through the intermediary of the capacitance 72. This current triggers the thyristor 71 and puts the two thyristors connected in series into the conducting state for the current coming from the load circuit. This current may be sent directly into the load or, if high powers are involved, it may be used to feed the gate of a more powerful thyristor 74 such as the one represented in FIG. 7. This thyristor 74 may also be connected in an anti-parallel manner to a diode 60 and in this way can be used in a polyphase circuit.

The present invention is not restricted to the embodiments which have been described herein and variants and modifications which are apparent to the person skilled in the art may be provided without departing from the scope of the invention.

What is claimed is:

1. An electrical circuit for closing or opening an AC load circuit when the voltage in the load circuit approaches zero immediately following the application of a control voltage from a control voltage source to said electrical circuit, the operation of said electrical circuit being insensitive to the characteristic of said load circuit, said electrical circuit comprising;
    a triac having a first main electrode $A_2$, a second main electrode $A_1$ and a control electrode,
    rectifying means connected across said first main electrode $A_2$ and said second main electrode $A_1$ and connected to said AC load circuit for applying a rectified voltage, the interruption of which is to be controlled, across said first and second main electrodes of said triac,
    at least one diode, said diode being connected in a series circuit with said control voltage source, said first main electrode and said control electrode of said triac, said diode being polarized so that the current that would flow through said triac from said control source and the current that would flow through said triac from said rectifying means when said triac is conducting have the same direction of current flow, whereby said triac can be triggered only close to a zero crossing of the voltage in said load circuit.

2. An electrical circuit according to claim 1, wherein said rectifying means is a rectifier bridge, one diagonal of which is connected to the main electrodes of said triac and the other diagonal of which is connected to said AC load circuit, and an impedance connected across the main electrodes of said triac.

3. An electrical circuit according to claim 1, characterized in that the control voltage is an alternating signal of a much higher frequency than that of the load voltage, further comprising a transformer, said control voltage being applied to the electrical cirrcuit by means of said transformer as a result of which the control and load circuits are galvanically insulated.

4. An electrical circuit according to claim 2, further comprising a second triac having a first main electrode $A_2$, a second main electrode $A_1$ and a control electrode, said second triac acting as a main switch and connected between the other diagonal of the rectifier bridge and the load cirrcuit, the main electrodes $A_1$ and $A_2$ of said second triac being connected in series with the load circuit, and said other diagonal of the rectifier bridge being connected to the main electrode $A_2$ and the gate electrode of said second triac, and wherein said impedance comprises first and second series connected impedances, the junction of said first and second impedances being conneected to the electrode $A_1$ of said second triac.

5. An electrical circuit according to claim 4, wherein the load circuit is a polyphase circuit.

6. An electrical circuit comprising two electrical circuits according to claim 1, the first main electrode $A_2$ of the triac of the first electrical circuit being connected with the first main electrode $A_2$ of the triac of the second electrical circuit, the load circuit being connected in series with the second main electrode $A_1$ of the triac of the first electrical circuit and the second main electrode $A_1$ of the triac of the second electrical circuit, the control voltage sources of the first electrical circuit and the second electrical circuit being connected in parallel.

7. An electrical circuit according to claim 1, further comprising a second diode connected across said first and second main electrodes of said triac, whereby a synchronous switch for polyphase circuits is obtained when such electrical circuits are inserted in the different phases of a polyphase circuit.

8. An electrical circuit according to claim 1, further comprising an auxiliary thyristor having a first main electrode, a second main electrode and a gate electrode, said auxiliary thyristor being connected in series with said main electrode of said triac and having at least four layers of alternate doping, the second main electrode of said auxiliary thyristor being connected to the first main electrode of said triac, whereby the electrical circuit is able to withstand high voltages.

* * * * *